United States Patent [19]

La Fontaine et al.

[11] Patent Number: 5,498,923
[45] Date of Patent: Mar. 12, 1996

[54] FLUORESENCE IMAGING

[75] Inventors: Bruno M. La Fontaine, East Quogue, N.Y.; Donald L. White, Morris Plains; Obert R. Wood, II, Little Silver, both of N.J.

[73] Assignee: AT&T Corp., Murray Hill, N.J.

[21] Appl. No.: 177,500

[22] Filed: Jan. 5, 1994

[51] Int. Cl.$^6$ ............................................. H01J 29/20
[52] U.S. Cl. .......................... 313/467; 313/468; 313/474
[58] Field of Search .................................. 313/467, 468, 313/474, 478

[56] References Cited

U.S. PATENT DOCUMENTS

| | | | |
|---|---|---|---|
| 3,917,950 | 11/1975 | Carlson | 250/483.1 |
| 4,739,399 | 4/1988 | Swann et al. | 358/93 |
| 4,835,437 | 5/1989 | Berkstresser et al. | 313/468 |
| 5,107,173 | 4/1992 | Iwasaki | 313/474 |
| 5,177,400 | 1/1993 | Iwasaki | 313/474 |

Primary Examiner—Sandra L. O'Shea
Assistant Examiner—ip Patel
Attorney, Agent, or Firm—George S. Indig

[57] ABSTRACT

A single crystal fluorescent material is used in the conversion of a short wavelength image. Conversion to a long wavelength image in the visible spectrum permits use of conventional glass optics for visual observation of UV and x-ray images. An illustrative use is in inspection of masks designed for use in fabrication of large scale integrated circuitry built to submicron design rules.

14 Claims, 2 Drawing Sheets

FLUORESENCE IMAGING

BACKGROUND OF THE INVENTION

1. Technical Field

A fluorescent image, produced by ultraviolet or soft x-ray irradiation of a fluorescent crystalline material is focused by use of conventional glass optics. Choice of material emitting in the visible spectrum permits viewing by the unaided eye. Highest resolution results from electronic processing of fluorescent images at ultraviolet wavelengths.

2. Description of the Prior Art

Optical microscopy is capable of resolution smaller than the wavelength of imaging light. The ultimate resolution of a microscope is defined by the 'incoherent cutoff spatial frequency'. It corresponds to a grating with lines and spaces of dimension:

$$\text{Resolution} = (K_1 \cdot \pi / NA \qquad \text{Eq. 1}$$

where NA is the numerical aperture of the microscope objective and $K_1$ is a dimensionless constant. At the cutoff frequency, $K_1 = 0.25$.

The "oil immersion" microscope avoids one obstacle to high resolution. It avoids reflections by use of a refractive index matching fluid between the object being studied and the objective lens. Its use permits resolution associated with attainment of NA values of 1.5 and higher. As an example, viewed radiation of wavelength $\lambda = 0.4$ μm, for NA=1.6, permitting ultimate resolution of 0.0625 μm, is attainable. This ultimate resolution corresponds to zero contrast. Useful resolution, for a still-low contrast image is $1.2 \times 0.0625$ μm=0.075 μm. A resolution value of about $1.5 \times 0.0625$ μm or 0.1 μm assures sufficient contrast for most purposes.

This known capability has provoked use of conventional glass optics for resolving features ordinarily considered the province of UV or x-ray. One effort uses image conversion from short wavelength to the visible or near-visible. The long wavelength image is produced by illumination of a fluorescent material. The approach has not gone into general use. The fluorescent material has been the problem. The obvious choice—the familiar cathode ray tube phosphors have proven unsatisfactory. Granularity of the powder films limits resolution. Thin fluorescent polymer films, in which fluorescence is produced by dissolved fluorescent species, does avoid granularity. Such polymer films, while producing high resolution images, are limited by brightness (and, therefore, by contrast). Increasing solute concentration increases brightness in initial use, but the films become unstable (and grainy) due to precipitation.

SUMMARY OF THE INVENTION

The invention provides for effective conversion of short wavelength images to longer wavelength by fluorescence, and for viewing of the converted image by use of glass transmission optics. Under certain circumstances, the invention may be used with electron beam radiation rather than electromagnetic radiation.

The contemplated wavelength range for the initial image is in the Deep Ultra Violet ($\lambda = 3000$ to 1000 Å) or Extreme Ultra Violet ($\lambda = 1000$ to 30 Å), generally below 0.26 μm. The converted image (the fluorescence wavelength) may be in the visible spectrum ($\lambda = 0.4$–0.7 μm) to permit direct viewing. Up-conversion, to wavelengths shorter than those of the visible spectrum is permitted, since within the transparency bandwidth of usual optical glasses, which retain needed values of refractive index over that bandwidth. Up-conversion to wavelengths beyond the visible in the near UV spectrum (e.g. $\lambda = 0.32$–0.4 μm), further increases resolution at the expense of direct viewing.

The advance depends on use of high efficiency, inorganic, single-crystal fluorescent materials. The fluorescent element may be a discrete flat screen, or may be combined with a focusing element in the optical array. The element may itself be a free-standing lens shaped from the fluorescent crystal, or it may be index-matched with a focusing element. The two elements may be matched through a fluid or a bonding layer.

It is useful to discuss the invention as including a "fluorescence" microscope. Uses, in fact, include high-resolution microscopy, in which the ultimate purpose is the converted image itself. Another use is inspection of lithographic masks, intended for use with DUV or EUV in the fabrication of submicron devices. Mask inspection (and repair) is a significant part of the cost in mask production, for use at these design rules. The invention permits inspection by direct viewing of the converted image and saves cost. The invention may serve for routine calibration of focus, image quality, and image intensity in DUV and EUV lithographic printers used in the VLSI industry. The terminology is intended to include these and other uses of the converted image.

DETAILED DESCRIPTION

1. General

Figure 1:
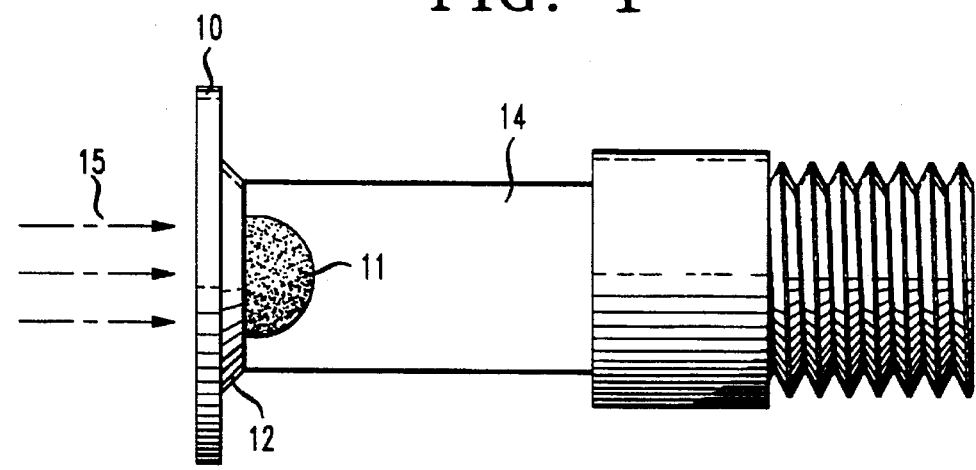
FIG. 1 is a front elevational view of apparatus in which the fluorescent element is index-matched to the objective lens by a matching fluid.

Apparatus and processes of this invention have one characteristic in common. All use a single crystal fluorescent element of a high efficiency inorganic material. Due to wavelength-dependent properties of the crystal, thickness is not critical. The penetration depth of the short wavelength radiation of the initial image (its absorption distance) in useful fluorescent crystals is sufficiently short to avoid one cause of image smearing so that it may serve in reflection or transmission. At the same time the crystalline material is chosen to be transparent to the up-converted radiation in the visible and near-visible spectrum, so that it may serve as a transmission element. Absence of absorption and scattering avoids brightness loss and a further cause of smearing. These properties permit use of thick free-standing or supported crystals.

Contemplated apparatus invariably includes one or more focusing elements. A prime advantage of the invention is to permit continued use of transmission optics for focusing. Alternative to or in addition to a tree-standing lens, itself formed of the fluorescent element, use may be made of one or more conventional glass focusing elements. Silica glass is particularly useful for up-converted images in the near UV. For convened images of wavelength within the visible spectrum, low melting mixed lens glasses may suffice. With the exceptions of free-standing optical elements made of fluorescent material, and of lenses serving as substrates for epitaxial growth of fluorescent material, it is likely that focusing elements will be constituted of glassy, rather than crystalline material, e.g. because of anisotrophy. A value of the invention lies in suitability of transmission optics. Reflective optics may be a useful adjunct. One or more reflective elements may be useful, for positioning the image.

Equipment needs are generally satisfied by small objective lens elements, (e.g. ≦2 mm diameter). Single crystals of this size are available and formation of the lens by grinding and polishing of the fluorescent crystal, itself, is feasible. Alternately, "composite lenses", may be constituted of index-matched pairs of the fluorescent crystal and glass lens. Matching generally requires an intermediate contacting medium. It may take the familiar form of the oil-immersion microscope or may use a matching bonding layer. Other uses may omit the matching fluid or layer and leave an air gap, at some cost in image quality, for convenience in interchanging fluorescent elements for obtaining a desired fluorescence wavelength.

Operating parameters depend upon needed contrast. A value of $K_1 = 0.25$ in Eq. 1 produces a zero-contrast convened image from a short-wavelength exciting image of a feature size equal to the Resolution value yielded by the equation. Multiplying by 1.2, yielding a value of $K_1=0.3$, results in a low contrast image which may be enhanced with computer-aided image processing. A preferred $K_1$ value of 0.375 corresponds with a multiplier of 1.5.

Figure 2:
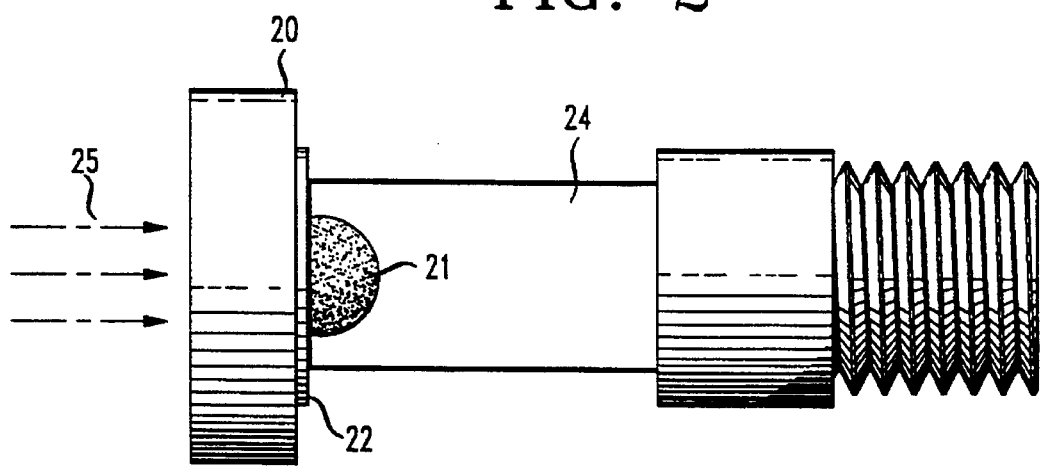
FIG. 2 is a front elevational view of alternative apparatus, providing for refractive index matching, but using a bonding layer in lieu of a fluid matching medium.

NA values greater than unity are obtainable in oil-immersion microscopes or in their solid-state equivalents (FIGS. 1,2). Use of short wavelength fluorescence within the specified fluorescence spectrum—use of fluorescence in the blue or near UV, e.g. $\lambda=3500$Å, is sufficient for resolving 0.1 μm features.

2. Composition of the Fluorescent Element

Suitable inorganic compositions have a fluorescence quantum efficiency of at least 25%. Available inorganic crystalline fluorescent materials with quantum efficiencies of 50% or more are available, and these constitute a preferred class. As compared with previously-used polymer materials, this consideration alone increases brightness for a given excitation intensity. The best, intrinsically fluorescent, polymer materials characteristically have quantum efficiencies of 10% or less, while the more usual doped polymers—with riopant levels to avoid precipitation—are less efficient. The inherent chemical stability of the intended class of inorganic crystals, permits operation at high brightness levels.

A useful class of fluorescent inorganic crystalline materials has been developed for use in electron-excited CRT phosphor screens. Grown as single crystals, they are suitable for purposes of this invention. Representative materials of this class have the necessary absorption bands for use with exciting radiation in the wavelength range from 0.2 μm–0.01 μm. These materials show required quantum efficiencies of 25% or better for selected excitation wavelengths in this range. Fluorescence is due to dopant atoms species in specific lattice sites, i.e. to substituent atoms. Energetic considerations dictate site selection—the equilibrium position of the substituent is the lowest free energy position. This leads to stability—does not favor relocation or precipitation of dopant. This contrasts with the doped polymer materials in which fluorescence centers, likely clusters rather than single atoms, are less stable.

Illustrative materials of this class are rare earth doped oxides. Examples are YAG and other garnets, aluminares and orthosilicates. Fluorescence over the wavelength range of $\lambda=0.32$ to $0.7$ μm is obtainable based on composition. Extensive work in the CRT phosphors is helpful in choosing the rare earth riopant and compatible host for the desired emission wavelength. As an example, a suitable composition for green emission ($\lambda=0.54$ μm) uses the yttrium aluminum garnet doped with a combination of 0.5% cerium and 0.27% terbium. This and other hosts in the class are readily doped to levels of 0.5% and greater with the rare earths to yield useful brightness. Multiple fluorescence centers—two or more fluorescent substituent atoms may be produced. In many instances, a second substituent atom serves to enhance energy exchange.

Examples of suitable CRT compositions are described in U.S. Pat. Nos.: 4,550,256 issued Oct. 29, 1985, 4,695,762 issued Sep. 22, 1987, 4,755,715 issued Jul. 5, 1988, 4,757, 232 issued Jul. 12, 1988 and 4,894,583 issued Jan. 16, 1990.

Illustrative materials and their absorption and emission wavelength values, relevant to this work, are tabulated:

TABLE

| Host | Dopant | Emission |
| --- | --- | --- |
| Yttrium Orthosilicate | Gd | 0.32 μm |
| Yttrium Orthosilicate | Tb | .54 |
| YAG (epitaxial) | Tb | .54 (.39, .42) |
| YAG (epitaxial) | Eu | .62 |
| YAG (epitaxial) | Pr | .495 |

For use here, the listed compositions are in single crystal form, rather than the usual particle layer used in CRTs. Self-supporting crystals are readily grown by a number of techniques, e.g., by crystal pulling. Supported layers are generally shaped from bulk crystals, and then bonded to the supporting substrate. Epitaxial growth may be useful since substrate lattice parameters are not required to satisfy optical requirements (although care in material choice and processing conditions must be taken to avoid dissolution of the fluorescent element in the substrate).

3. Illustrative Embodiments

Reference is made to the Figures in describing apparatus design and processing conditions.

The oil immersion microscope of FIG. 1 or the variant of FIG. 2 may have a numerical aperture value of 1.5, or larger, depending on values of refractive index. The factor, $K_1$ at the cut-off incoherent frequency is 0.25. Selection of a fluorescence line at $\lambda=500$ nm yields ultimate resolution of 830 nm (the zero-contrast image)—for useful contrast, using the multiplier 1.2, an acceptable image is obtained from an initial (short wavelength) image having 1000 nm (0.1 μm features). With a fluorescent crystal of higher refractive index (n=1.85), an NA value of 1.6 is obtainable. The ultimate, zero contrast image, at a wavelength in the near UV, e.g. λ =320 nm, has a resolution of 0.05 μm (yielding useful contrast in a converted image produced by conversion from an initial image having 1.2×0.05=0.06 μm features).

The apparatus of FIG. 1 is of familiar form. (See *Photomicroscopy*, R. P. Loveland, John Wiley & Sons, Inc., (1970) showing this design at p. 73). The standard design is supplemented by the single crystal phosphor element 10, which is at the input end of lens 11. The two may be coupled with a matching fluid at 12.

The remainder of the structure is conventional. For short focal length optics, ~2 mm or less, most of the magnification is provided by lens 11. Additional elements not shown, are provided for correcting aberrations introduced by lens 11.

Patterned radiation 15 the existing radiation, produces an image on the incident surface of element 10. This, in turn, produces a long-wavelength image on element 11. The fluorescent pattern which may be magnified by element 11 (here depicted as convex) and projected through barrel 14 to the detector (not shown) where it is processed, e.g., viewed or recorded by means such as a video camera, a photomultiplier tube, a photo CD array, etc. The image may be displayed or further processed by computer to best utilize information in the exciting image.

Use of a matching fluid (or other intimately-contacting matching layer) between the fluorescent element and the glass lens lessens loss due to reflections. Index matching permits total internal reflection of large angle light rays for best resolution. Use of a fluid rather than a solid, permits relative movement of the fluorescent element and the lens and expedites fine focusing.

In FIG. 2, the matching fluid has been replaced by a clear solid 22 of matching index, e.g., by a commercial lens bonding cement. Fluorescent crystal element 20, lens element 21, and objective barrel 24 correspond with elements 10, 11, and 14 of FIG. 1. Features identified by legends 22 and 24 serve the functions of features 12 and 14 of FIG. 1.

Figure 3:
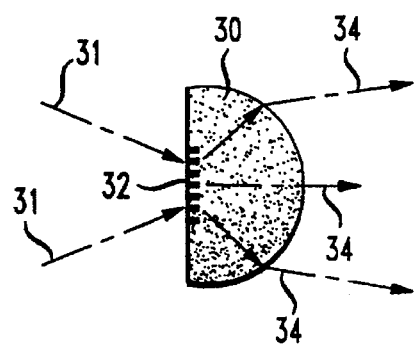
FIG. 3 is a schematic representation of a shaped fluorescent element having a flat "screen" surface on the input side and a convex lens surface on the output side.

Element 30 of FIG. 3, serving both as the fluorescent element and a first lens element, is constructed of a self-supporting fluorescent crystal. In simplest form, element 30 is a sphere, with one side ground and polished to a flat surface. Dimensions are determined by index of refraction and desired focal length. Constructing the fluorescent element and lens of one single crystal, avoids some problems. Epitaxial growth at the expense of increased birefringence, on a flat or curved surface of a crystalline lens element is possible. Composite lenses are more likely made by adhesive bonding of a single-crystal fluorescent element and a glass lens.

In use, incoming patterned radiation 31, produces image 32 on flat surface 33. Emitted fluorescence radiation 34 is focused by lens 30.

Figure 4:
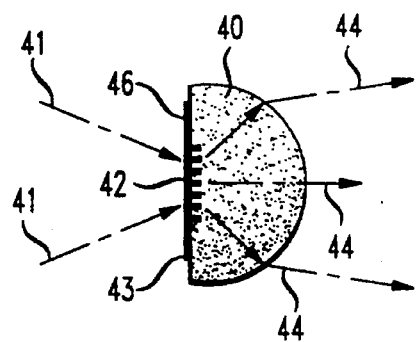
FIG. 4 is a schematic representation of an element similar to that of FIG. 3, but provided with a reflective layer on the input surface. This reflective layer, transmissive to the exciting radiation, but reflective to the fluorescence, improves efficiency by utilizing fluorescent radiation which would otherwise escape.

The apparatus of FIG. 4 differs from that of FIG. 3 in providing for a filtering film 46 on the flat facet 42 of element 40. Film 46 is made of material which is transparent to incoming patterned radiation 41 but is reflective of emitted radiation 47. Beryllium and silicon are suitable film materials for use in the UV spectrum, and are readily deposited by evaporation. In the instance of x-ray (EUV) at λ≦200Å, the small absorption depth of the short wavelength exciting radiation assures small separation of the virtual image from the real image and avoids serious image degradation.

Figure 5:
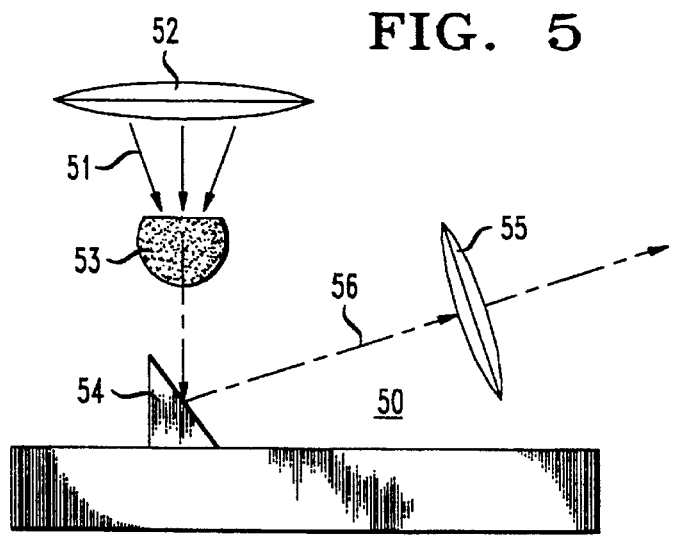
FIG. 5 is a schematic representation of one arrangement for examining the exciting aerial image of a UV or x-ray projection system.

In FIG. 5, a fluorescence microscope 50 is used to examine an aerial image 51 created by DUV or EUV projection camera 52. To conserve space, the fluorescence microscope 50 is folded with only first phosphor/lens element 53 and the folding mirror 54 under the camera 52. This arrangement may be accommodated within a 2–3 mm space. The remainder of the microscope represented by lens 55 is to the side. In operation, the image of a test-mask, not shown, is projected on the flat surface of element 53, and is converted into an optical image represented by arrow 56. The optical image may be recorded and processed by a computer for any of the purposes contemplated e.g. for mask examination, for registration focusing, for detection of aberrations, or in microscopy. This procedure takes less time than the customary, photoresist exposure using the "focus-exposure array" (which relates image quality to intensity and height, i.e. to focus).

Figure 6:
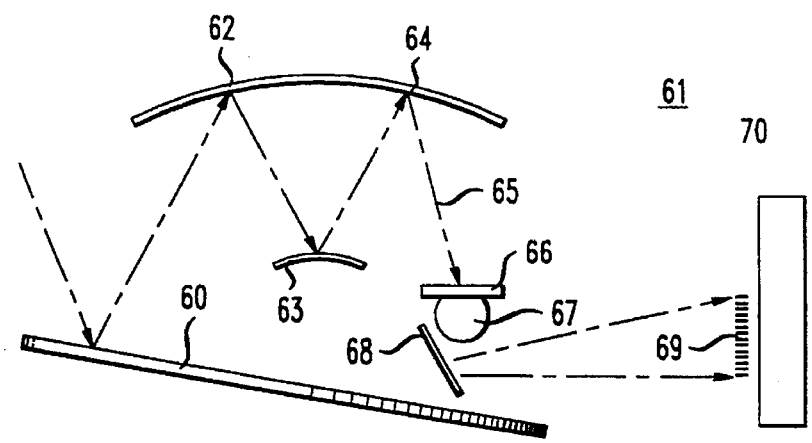
FIG. 6 is a schematic representation of apparatus for producing a realtime, long-wavelength image from a reflective x-ray projector.

In FIG. 6 an x-ray (EUV) reflection mask 60 is being inspected for defects using x-ray radiation to form the initial short-wavelength image. The camera 61 uses a 1:1 Offnet 3-mirror system with reflection points at 62, 63 and 64. The initial image 65, likely scanned at constant speed, is focused on the surface of fluorescent element 66, in this instance, part of a composite lens including lens element 67. The converted long wavelength "optical" image is made incident on folding mirror 68 which directs the focused image 69 to detector 70. The arrangement permits magnification of 100× or greater. Apparatus 70, a CCD detector or video camera, converts the optical image into electronic signals which are then sent to a computer, not shown, for comparison of the electronic pattern with the data base for an ideal mask. Any differences are evaluated for their impact on the lithographic process, leading to repair or rejection if consequential.

The operation of FIG. 6 likely follows initial visual mask inspection. It may reveal significant defects which are visible only in the EUV.

The example of a 1:1 camera in the apparatus of FIG. 6 has one advantage in mask inspection. Mask features in lithography are often 4 or 5 times larger than the ultimate size printed on wafers, i.e., for 0.1 design rule, in the 0.5 μm range. while not strictly resolvable, are, in practice, detectable. Magnification at this stage reduces intensity of the initial image which is likely the limiting consideration for conversion efficiency.

The invention lends itself to mask inspection at DUV or EUV wavelengths. For 4× or 5× feature reduction, masks may have features in the 0.5–1.25 μm range. If the EUV or DUV mask being inspected is for fabrication of 0.2 μm design-rule devices, the mask will have 0.8 to 1.0 micron features. Fluorescent optics permit observation of defects smaller than 0.1 microns, which is sufficient for mask inspection. Inspection at the intended wavelength of use may be advantageous over visual inspection, without regard to resolution, in revealing defect centers that do not respond to longer wavelength.

The invention lends itself to inspection of electron beam images—e.g., those produced by use of transparency-absorption masks analogous to masks generally used for defining electromagnetic wave images. Electrons used in e-beam lithography penetrate to depths of several microns. If a thick fluorescent crystal were used, the deep penetration would smear the image. However, if a thin epitaxial fluorescent layer (or this layer applied by other means) were grown on a nonfluorescent substrate—the fluorescent image would have high resolution. Images defined in terms of feature regions of unscattered electron radiation in contrast with regions of scattered radiation may also be used to excite the fluorescent crystal element. Masks, for use in LSI fabrication with electron-pattern delineation, likely at design rules below the short wavelength limit of the visible spectrum, may be examined. The single crystal phosphor compositions, many of which were developed for (electron-excited) CRT use, lend themselves to excitation with electrons. As with electromagnetic radiation masks, some advantage may be gained by radiation intended for ultimate mask delineation—in this instance by electrons.

Figure 7:
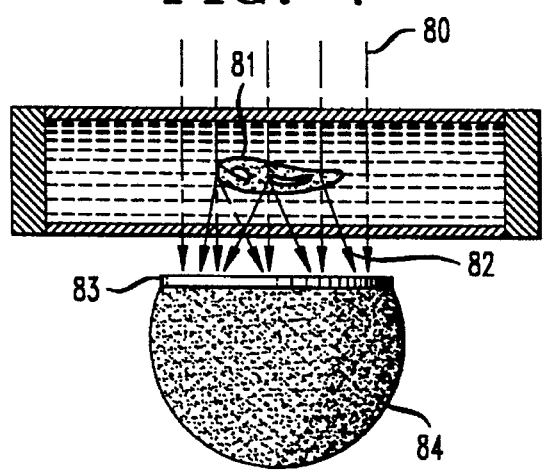
FIG. 7 is a schematic representation of apparatus for converting an x-ray hologram into its long-wavelength analog.

The arrangements of the invention may serve a number of other purposes. FIG. 7 describes use of a Gabor (on-axis) hologram. A collimated, narrow band, x-ray beam 80, centered at a wavelength of 50Å, illuminates object 81, illustratively a bacterium. Every absorbing point and every change in refractive index scatters x-rays. If the temporal coherence length is large enough, the scattered rays 82 interfere with the unscattered beam 80 to produce a holographic image on fluorescent layer 83. This image, now converted to long wavelength, is focused by index-matched glass lens 84, ultimately to be reconstructed.

Holographic imaging is described e.g. in "X-Ray Microscopy", G. Schmahl and D. Rudolph, *Springer Series in Optical Sciences*, Vol. 43, pp. 318–343 (1984). Briefly, an object of size, S, scatters radiation into a ±θ cone of angles (where θ=λ/S). The scattered wave interferes with the unscattered wave, creating fringes of period, a≈2λ/θ.

Use may be made of radiation in the range, λ=30Å–45 Å, the "water window" (in which water is transparent and organic materials are absorbing) to enable real time observation of biological activity (e.g. inside bacteria).

4. Examples

Example 1. The apparatus of FIG. 1 is used without a matching layer. The fluorescent element is composed of a phosphor is single crystal host of yttrium orthosilicate containing the trivalent 4*f* rare earth fluorescent ion, terbium$^{3+}$. The composition is $(Y_{1.78}Tb_{0.22}SiO_5)$. The fluorescent element is disk-shaped, of diameter, 10 mm and thickness, 0.5 min. It is spaced by 0.1 mm from a 50× objective lens having an NA of 0.85. An exciting x-ray image at λ= 13.5 nm, of design rule 0.25 μm, made incident on the fluorescent element, is enlarged and the up-converted image of λ=0.54 μm, is visually viewed in real time. Contrast is estimated at 10–20%.

Example 2. A self-supporting fluorescence/lens element is made of gadoliniumodoped yttrium orthosilicate to yield a converted image at λ=320 nm (0.320 μm). Used for mask inspection of a 5×EUV, 0.5 μm—feature mask at the intended delineating radiation of λ=0014 μm, the system has a resolution limit approaching 0.05 μm. This is sufficient for detection of 0.1 μm defects in accordance with expected manufacturing requirements. Using the arrangement shown in FIG. 6, the initial image, the converted 0.320 μm image is projected on a CCD silicon detector, enhanced for radiation of this wavelength.

The mask is scanned following a serpentine path, to sweep the fluorescent lens and produce a converted 0.320 μm image on the CCD array. Output information is introduced into a computer which compares the observed data with ideal mask information in memory, and differences are analyzed to be noted as possible defects. While 0.05 μm defects are not rigorously resolved, their presence is nevertheless detected (as fuzzy details of poor image quality).

Example 3. The apparatus of FIG. 7 is used for making an x-ray hologram of a living bacterium. As shown, the specimen is contained in a water-filled cell above a self-supporting composite fluorescent/lens element. Cell thickness and cell-to-lens spacing is tens of microns. The specimen is illuminated by a collimated x-ray beam, nominally of λ= 4 nm (0.004 μm), of ±1% bandwidth. A pulsed laser source is used for a 10 nsec flash exposure. Interference fringes, produced by interaction of scattered and unscattered radiation, are projected onto the fluorescent lens element, and the converted holographic image is projected into the CCD detector, where it is analyzed to yield a reconstructed image of the bacterium.

Reconstruction of a 160× image follows recording on photographic film, development, and illumination with a helium-neon laser. The system may be used to produce a 3-D moving picture image at resolution of 0.1 μm or better.

Example 4. The lens of FIG. 4 is used in the folded apparatus of FIG. 3 for on-line fine tuning and registration of a 5× EUV VLSI mask. The 0.5 μm mask image is produced by illumination with 14 nm radiation. A converted image at 0.32 μm is produced by a fluorescent element of Gadolinium in an orthosilicate host.

We claim:

1. Apparatus providing for conversion of an initial image, defined by electromagnetic radiation of energy greater than that of electromagnetic radiation of a wavelength of 0.26 μm, into a converted image defined by electromagnetic radiation of wavelength longer than 0.26 μm, in which the initial image is made incident on a first surface of a fluorescent element, so as to produce a converted image by fluorescence, and in which the convened image is focused by a first lens element,

CHARACTERIZED IN THAT the fluorescent element is a single crystal of an inorganic composition containing a fluorescent substituent atom and in that the fluorescent element is refractive-index-matched to the first lens element.

2. Apparatus of claim 1 in which the fluorescent element is a freestanding single crystal.

3. Apparatus of claim 1 in which the fluorescent element is a bonded layer.

4. Apparatus of claim 1 in which the convened image is focussed by a first lens element.

5. Apparatus of claim 4 in which the first lens element and the fluorescent element are constituted of one single crystal.

6. Apparatus of claim 1 in which the substituent atom is a rare earth atom.

7. Apparatus of claim 6 in which the single crystal is of crystal structure selected from the group consisting of garnet, aluminate, and orthosilicate.

8. Apparatus of claim 1 in which the converted image is produced on a second surface of the fluorescent element.

9. Apparatus of claim 8 in which the first surface of the fluorescent element is coated with a filter material having wavelength-dependent transparency, the filter material being substantially transparent for the radiation defining the initial image.

10. Apparatus of claim 1 in which the converted image is produced on the first surface of the fluorescent element.

11. Process comprising examination of an initial radiation image of an energy greater than that of electromagnetic radiation of a wavelength of 0.26 μm, to yield a converted fluorescence image of longer wavelength, the process further comprising focusing the converted image by a first lens element,

CHARACTERIZED IN THAT the initial image is projected onto a single crystal fluorescent element which is refractive-index-matched to the first lens element.

12. Process of claim 11 for inspection of a mask designed for operation with electromagnetic radiation.

13. Process of claim 12 for inspection of a VLSI mask.

14. Process of claim 11 for on-line monitoring during pattern delineation in fabrication of VLSI.

* * * * *